(12) United States Patent
Ki et al.

(10) Patent No.: US 10,607,905 B2
(45) Date of Patent: *Mar. 31, 2020

(54) PACKAGE SUBSTRATE FOR A SEMICONDUCTOR PACKAGE HAVING LANDING PADS EXTENDING TOWARD A THROUGH-HOLE IN A CHIP MOUNTING REGION

(71) Applicant: Samsung Electronics Co., Ltd., Suwon-si (KR)

(72) Inventors: Baek Ki, Yongin-si (KR); Tark-Hyun Ko, Cheonan-si (KR); Kun-Dae Yeom, Asan-si (KR); Yong-Kwan Lee, Hwaseong-si (KR); Keun-Ho Jang, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/441,591

(22) Filed: Jun. 14, 2019

(65) Prior Publication Data

US 2019/0295909 A1 Sep. 26, 2019

Related U.S. Application Data

(63) Continuation of application No. 15/641,288, filed on Jul. 4, 2017, now Pat. No. 10,361,135.

(30) Foreign Application Priority Data

Sep. 12, 2016 (KR) .......................... 10-2016-0117499

(51) Int. Cl.
*H01L 23/10* (2006.01)
*H01L 23/13* (2006.01)
(Continued)

(52) U.S. Cl.
CPC ............ *H01L 23/10* (2013.01); *H01L 21/565* (2013.01); *H01L 23/057* (2013.01); *H01L 23/13* (2013.01);
(Continued)

(58) Field of Classification Search
CPC ....... H01L 23/10; H01L 23/00; H01L 21/565; H01L 23/057; H01L 23/13; H01L 24/16;
(Continued)

(56) References Cited

U.S. PATENT DOCUMENTS 6,124,547 A 9/2000 Fujimori
9,196,538 B2 11/2015 Hong et al.
(Continued)

FOREIGN PATENT DOCUMENTS

JP 4861907 B 12/2008
JP 2016048752 A 8/2014
(Continued)

*Primary Examiner* — Alexander O Williams
(74) *Attorney, Agent, or Firm* — Muir Patent Law, PLLC

(57) ABSTRACT

A semiconductor package includes a package substrate including at least one through-hole in a chip mounting region, a plurality of wiring patterns at a top surface of the package substrate. The wiring patterns include respective extension portions and respective landing pads. At least some of the landing pads obliquely extend toward the through-hole. Conductive bumps are formed on corresponding landing pads to connect to a semiconductor chip mounted on the chip mounting region of the package substrate. A molding material extends between the top surface of the package substrate and the semiconductor chip and fills the through-hole.

20 Claims, 12 Drawing Sheets

(51) Int. Cl.
*H01L 21/56* (2006.01)
*H01L 23/538* (2006.01)
*H01L 23/057* (2006.01)
*H01L 23/00* (2006.01)
*H01L 23/31* (2006.01)

(52) U.S. Cl.
CPC ...... *H01L 23/5384* (2013.01); *H01L 23/5386* (2013.01); *H01L 24/16* (2013.01); *H01L 21/561* (2013.01); *H01L 23/3128* (2013.01); *H01L 24/13* (2013.01); *H01L 24/14* (2013.01); *H01L 24/81* (2013.01); *H01L 24/97* (2013.01); *H01L 2224/13082* (2013.01); *H01L 2224/13111* (2013.01); *H01L 2224/13147* (2013.01); *H01L 2224/13155* (2013.01); *H01L 2224/1412* (2013.01); *H01L 2224/16225* (2013.01); *H01L 2224/16227* (2013.01); *H01L 2924/15151* (2013.01); *H01L 2924/181* (2013.01)

(58) Field of Classification Search
CPC ....... H01L 2224/16227; H01L 23/5384; H01L 23/5386; H01L 21/561; H01L 23/3128; H01L 24/14; H01L 2224/13082; H01L 2224/13111; H01L 2224/13147; H01L 2224/13155; H01L 2224/1412; H01L 2224/16225; H01L 2924/15151; H01L 2924/181; H01L 2924/00012; H01L 2924/01047; H01L 2924/01029; H01L 2924/00014

USPC .......................................... 257/737, 738, 778
See application file for complete search history.

(56) References Cited

U.S. PATENT DOCUMENTS

| | | | |
|---|---|---|---|
| 10,361,135 | B2 * | 7/2019 | Ki .......................... H01L 23/10 |
| 2009/0266582 | A1 | 10/2009 | Sakurai et al. |
| 2012/0061880 | A1 | 3/2012 | Han et al. |
| 2012/0307445 | A1 | 12/2012 | Lee et al. |
| 2014/0124914 | A1 | 5/2014 | Lin et al. |
| 2015/0048501 | A1 | 2/2015 | Park |
| 2015/0221587 | A1 | 8/2015 | Kindo |
| 2015/0270243 | A1 | 9/2015 | Yang et al. |
| 2015/0327372 | A1 | 11/2015 | Sakamoto |
| 2017/0162742 | A1 | 6/2017 | Prajuckamol et al. |
| 2018/0076105 | A1 * | 3/2018 | Ki ......................... H01L 23/057 |
| 2018/0076187 | A1 | 3/2018 | Karakane et al. |

FOREIGN PATENT DOCUMENTS

| | | |
|---|---|---|
| KR | 0274993 B | 1/2001 |
| KR | 0691443 B | 3/2007 |
| KR | 20090122514 A | 12/2009 |
| KR | 20110047834 A | 5/2011 |
| KR | 20110092045 A | 8/2011 |
| KR | 20110097382 A | 8/2011 |
| KR | 1111430 B | 2/2012 |
| KR | 20130107050 A | 10/2013 |

* cited by examiner

PACKAGE SUBSTRATE FOR A SEMICONDUCTOR PACKAGE HAVING LANDING PADS EXTENDING TOWARD A THROUGH-HOLE IN A CHIP MOUNTING REGION

CROSS-REFERENCE TO RELATED APPLICATION

This application is a continuation of U.S. application Ser. No. 15/641,288 filed Jul. 4, 2017 and issued as U.S. Pat. No. 10,361,135 on Jul. 23, 2019, which claims priority under 35 U.S.C. § 119 to Korean Patent Application No. 10-2016-0117499 filed on Sep. 12, 2016 in the Korean Intellectual Property Office, the disclosure of each of these applications hereby incorporated by reference in its entirety.

TECHNICAL FIELD

Example embodiments of the present disclosure relate to a package substrate, a semiconductor package including the same and a method of manufacturing the semiconductor package.

RELATED ART

A flip chip process is used in manufacture of smaller and lighter semiconductor packages. In the flip chip process, a filling material such as a molding resin may be interposed between a semiconductor chip and a package substrate. The filling material relieves a difference of a thermal expansion coefficient between the semiconductor chip and the package substrate and protects solder bumps between the semiconductor chip and the package substrate.

In the flip chip process, the filling material may be a mold resin that fills spaces between the semiconductor chip and the package substrate. When there is a difference in a flow rate of the mold resin, a void between the semiconductor chip and the package substrate can be generated.

SUMMARY

According to example embodiments of the inventive concepts, a semiconductor package may include a package substrate, a plurality of wiring patterns, a plurality of conductive bumps, a semiconductor chip and a molding material. The package substrate may include at least one through-hole in a chip mounting region. The plurality of wiring patterns may be disposed at a top surface of the package substrate and may include landing pads. At least some of the landing pads obliquely extend toward the through-hole. The plurality of conductive bumps may be disposed on the landing pads. The semiconductor chip may be mounted on the chip mounting region of the package substrate. The plurality of conductive bumps may be between the semiconductor chip and the package substrate. The molding material may cover the top surface of the package substrate and the semiconductor chip and may fill the through-hole.

According to example embodiments of the inventive concepts, a package substrate for a semiconductor package may include a substrate core including a through-hole penetrating the substrate in a chip mounting region and a plurality of wiring patterns at a top surface of the substrate. The plurality of wiring patterns may include landing pads. At least some of the landing pads obliquely extend toward the through-hole. Each of the landing pads may be configured to be connected to an external terminal in the chip mounting region of the package substrate. Example embodiments also contemplate related methods of manufacturing.

According to example embodiments of the inventive concepts, a semiconductor package may include a package substrate, a first semiconductor chip mounted on the package substrate, a plurality of conductive bumps, and a molding material. The package substrate may include a package substrate core, first wiring patterns on a top surface of the package substrate core, each of the first wiring patterns comprising a first landing pad and a first extension portion connected to the first landing pad and extending away from the first landing pad to provide an electrical connection between the first landing pad and a remaining portion of the first wiring pattern, and an insulating layer, formed on the first wiring patterns and having an opening exposing the first landing pads of the first wiring patterns. Each of the plurality of conductive bumps may be formed directly on a corresponding one of the first landing pads and providing an electrical connection to the first semiconductor chip. The molding material may be extended between the first semiconductor chip and the package substrate, encapsulated each of the plurality of conductive bumps, and extended through the first through-hole. The first landing pads may comprise a first continuous group of landing pads formed about the first through-hole and at least a majority of the first landing pads may be connected to a corresponding first extension portion at a corresponding oblique angle to extend toward the first through-hole.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein. It should be appreciated that the example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Figure 1:
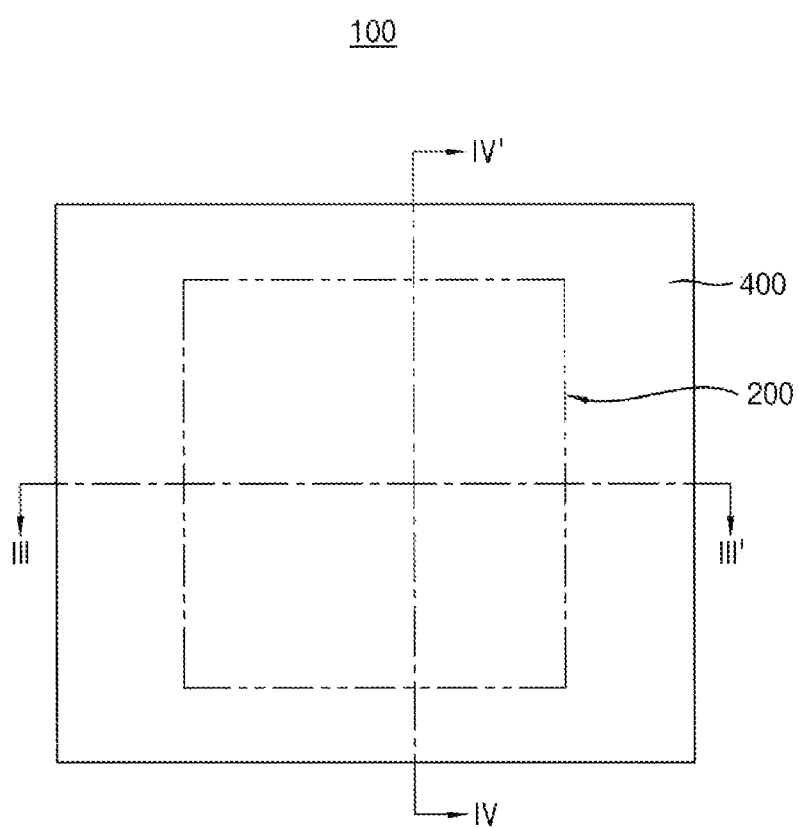
FIG. 1 is a top-down plan view illustrating a semiconductor package according to an example embodiment.
Figure 2:
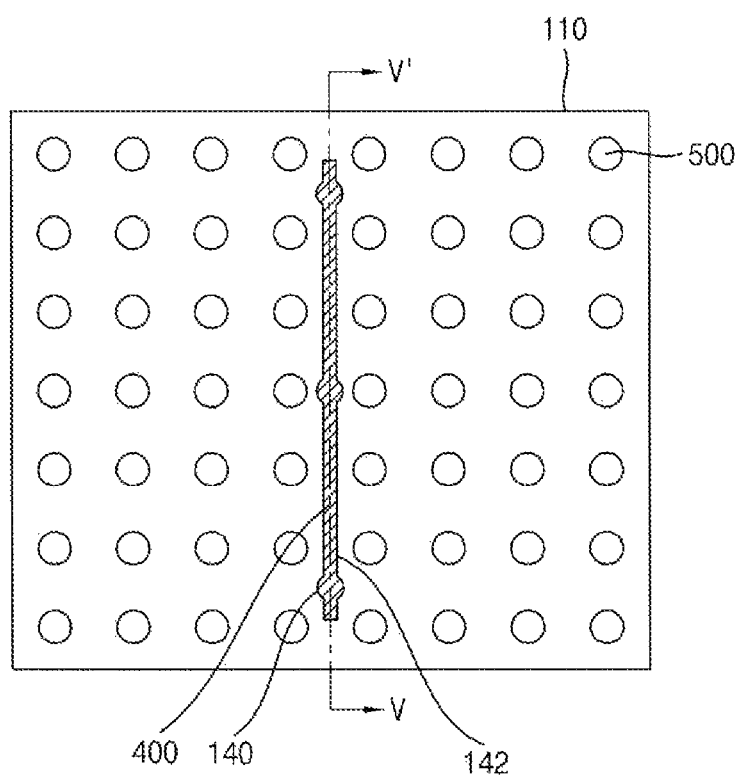
FIG. 2 is a bottom-up plan view illustrating a semiconductor package according to an example embodiment.
Figure 3:
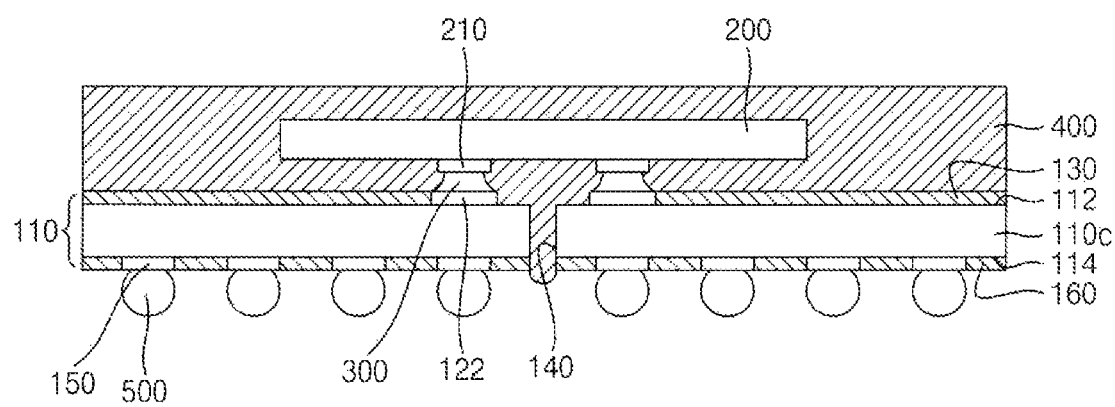
FIGS. 3 through 5 are cross-sectional views taken along lines IV-IV' and V-V' of FIG. 1, respectively, illustrating the semiconductor package of FIG. 1 according to example embodiments.
Figure 4:
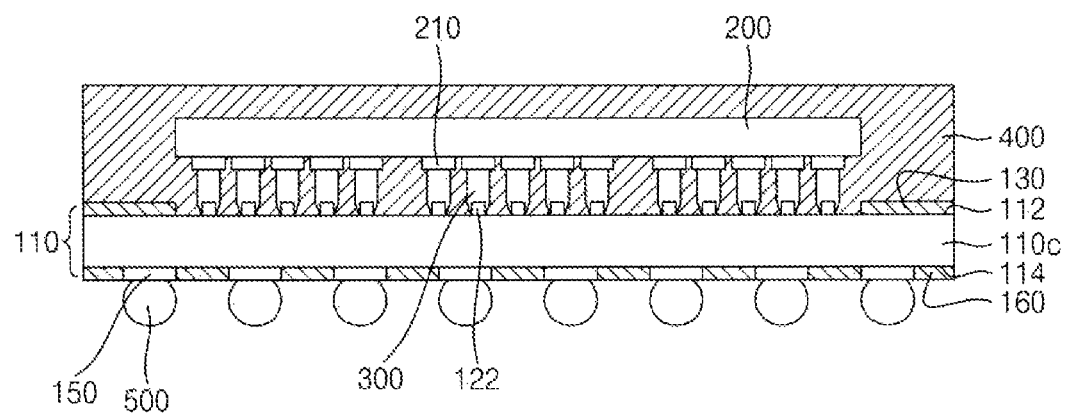
Figure 5:
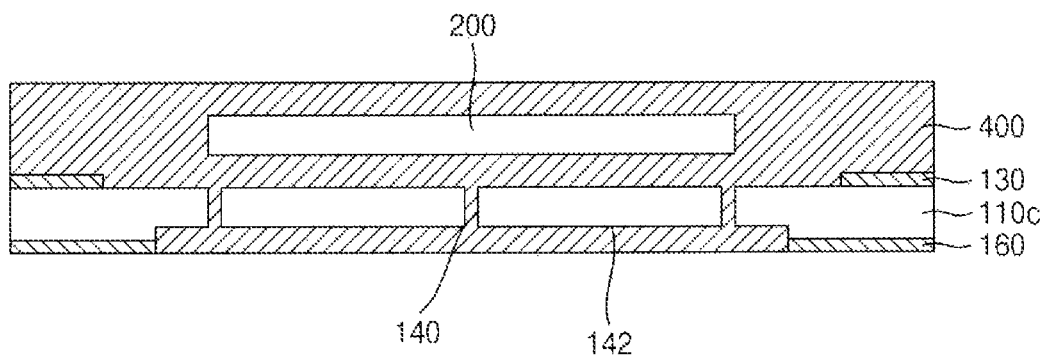
Figure 6:
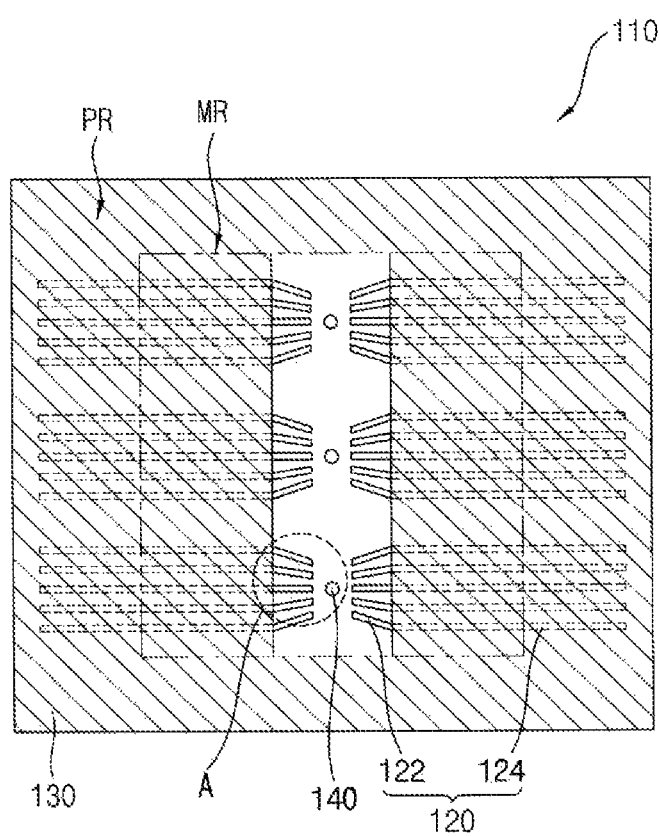
FIG. 6 is a plan view illustrating a package substrate according to an example embodiment.
Figure 7:
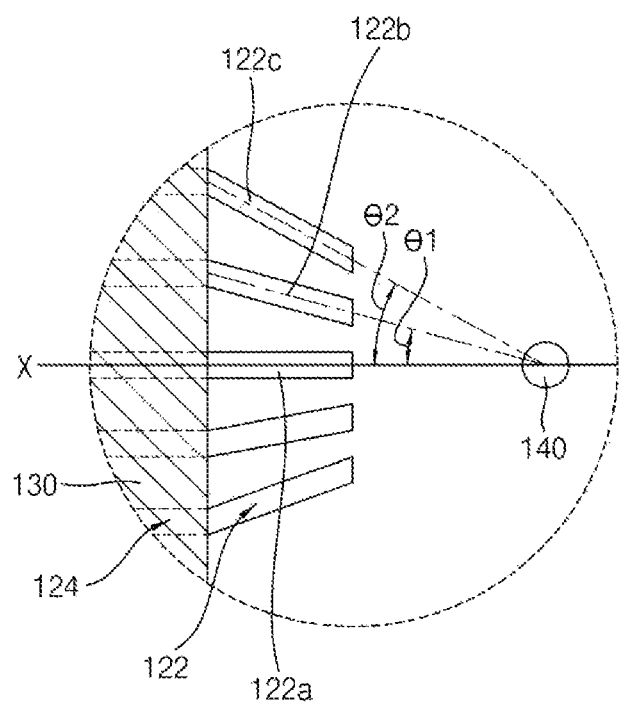
FIG. 7 is an enlarged view illustrating portion A of FIG. 6 according to an example embodiment.
Figure 8:
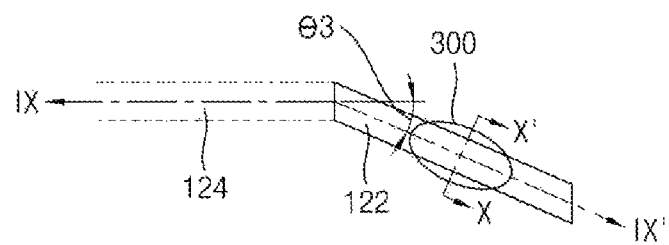
FIG. 8 is a plan view illustrating a conductive bump on a landing pad of FIG. 6 according to an example embodiment.
Figure 9:
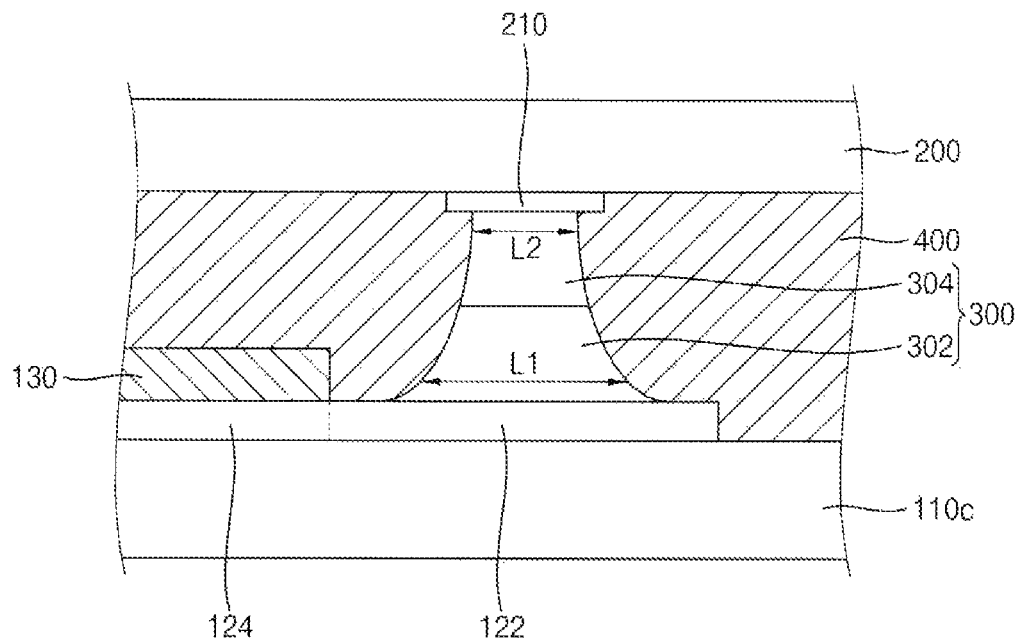
FIGS. 9 and 10 are cross-sectional views taken along lines IX-IX' and X-X' of FIG. 8, respectively, according to example embodiment.
Figure 10:
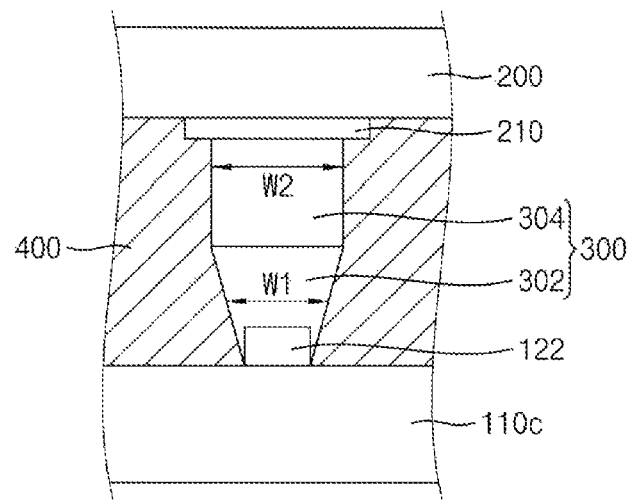
Figure 11:
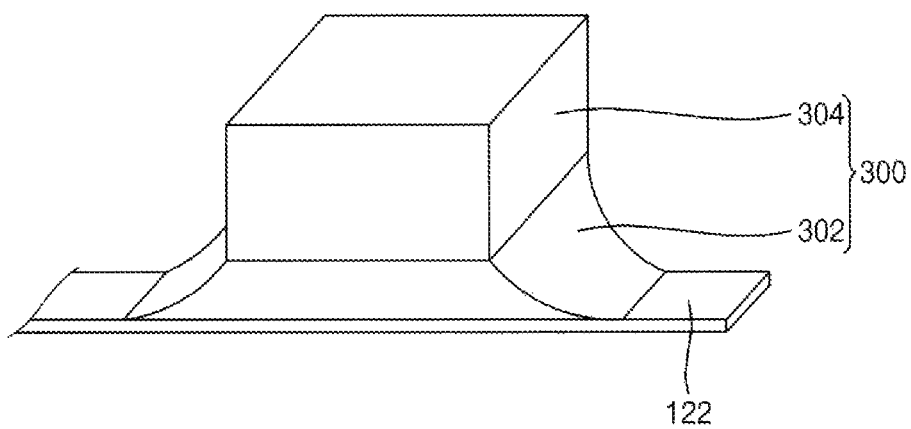
FIG. 11 is a perspective view illustrating the conductive bump of FIG. 8 according to an example embodiment.

FIG. 1 is a top-down plan view illustrating a semiconductor package according to an example embodiment. FIG. 2 is a bottom-up plan view illustrating the semiconductor package of FIG. 1. FIGS. 3 through 5 are cross-sectional views taken along lines IV-IV' and V-V' of FIG. 1, respectively, illustrating the semiconductor package of FIG. 1. FIG. 6 is a plan views illustrating a package substrate of FIG. 1 according to an example embodiment. FIG. 7 is an enlarged view illustrating portion A of FIG. 6. FIG. 8 is a plan view illustrating a conductive bump on a landing pad of FIG. 6. FIGS. 9 and 10 are cross-sectional views taken along lines IX-IX' and X-X' of FIG. 8. FIG. 11 is a perspective view illustrating the conductive bump of FIG. 8.

Referring to FIGS. 1 through 11, a semiconductor package 100 may include a package substrate 110 comprising a package substrate core 110c, a plurality of circuit wires and first and second insulating layers 130 and 160. The circuit wires of the package substrate 110 include a plurality of wiring patterns 120 on a top surface 112 of the package substrate core 110c, each wiring pattern 120 including a landing pad 122. The landing pads 122 may comprise a terminal of the corresponding wiring pattern of which it forma a part, and may also comprise a terminal of the package substrate 110. The circuit wires of the package substrate 110 may include external connection pads 150 on a bottom surface 114 of the package substrate core 110c. The semiconductor package 100 may also include a plurality of conductive bumps 300 on a corresponding one of the landing pads 122, one or more semiconductor chips 200 mounted on a top surface of the package substrate 110 with the conductive bumps 300 therebetween, and a molding material 400 on the package substrate 110 to cover the semiconductor chip(s) 200. For ease of explanation in this disclosure, only one semiconductor chip 200 is illustrated with respect to a single semiconductor package 100 (and/or a chip mounting area MR), however, additional semiconductor chips 200 may be included in a semiconductor package 100 (such as provided in a stack of semiconductor chips 200 on package substrate 100, and/or spaced apart on and mounted to different areas (with respect to a top down view) of the semiconductor package 100.

The package substrate core 110c has a top surface 112 and a bottom surface 114 which are opposite to each other. The package substrate 110 may be a printed circuit board (PCB) substrate. The PCB substrate may be a multilayer circuit board including conductive vias and various circuit wires (which may include wiring patterns 120) according to an example embodiment. For example, the package substrate 110 may comprise a package substrate core 110c that may be formed of one or more layers of a polymer, such as polyimide, with wiring (e.g., wiring redistribution layers) on surfaces of the one or more layers of polymer to interconnect terminals (such as landing pads 122) formed at the upper and lower surfaces of the package substrate 110. Outermost ones of the polymer layers may form the top surface 112 and bottom surface 114 of the package substrate core.

The package substrate 110 may include a chip mounting region MR and a peripheral region PR surrounding the chip mounting region MR. The semiconductor chip 200 may be disposed on the top surface 112 of the package substrate 110. The semiconductor chip 200 may be mounted on the chip mounting region MR and have a footprint (e.g., area from a top down view) matching the area of the chip mounting region MR.

A plurality of wiring patterns 120 may be disposed on the top surface 112 of the package substrate core 110c. The wiring patterns 120 may form an outermost (here, uppermost) wiring layer of the package substrate 110. The wiring patterns 120 may each include a landing pad 122 and an extension portion 124 connecting the landing pad 122 to remaining portions of the wiring pattern 120 (not shown). For example, a part of each of wiring patterns 120 may be used as the landing pad (e.g., a connection pad) 122 to be electrically connected to the semiconductor chip 200, such as to a corresponding chip pad of the semiconductor chip. A plurality of landing pads 122 may be disposed in the chip mounting region MR. The landing pads 122 may each be positioned at an end portion of each of wiring patterns 120. In some examples, the landing pads 122 may have a width that is greater than the other portions of the wiring pattern 120 to which they are connected ("width" in this context referring to, with respect to a plan view, a direction perpendicular to the lengthwise extending direction of the wiring patterns).

Referring to. FIG. 6, the wiring patterns 120 may be spaced apart from each other. In this example, the extension portions 124 of the wiring patterns 120 extend from the chip mounting region MR to the peripheral region PR. In this example, extension portions of the wiring patterns 120 extend in a first direction and are parallel to each other. The landing pads 122 may extend in the first direction (parallel to the length direction of the extension portion 124 of the wiring patterns 120) or a direction different from the first direction in the chip mounting region MR. Thus, the length direction of the landing pads 122 may be the same as or different from the length direction of the extension portions 124 of the wiring patterns 120. Referring to FIG. 8, when the length direction of the landing pads 122 is different from the length direction of the extension portion 124 of the wiring patterns 120, the landing pads 122 may obliquely extend at a respective certain angle θ3 with respect to the respective extension portion 124 of the wiring patterns 120 to which it is connected (it will be apparent that angle θ3 may differ for different wiring patterns 120). It will be appreciated that "length direction" (or similar terminology) as used herein refers to the direction of the length of an object (e.g., length of the wiring), where "length" refers to the greater dimension of the object (in this disclosure, with respect to a plan view, such as a top down or bottom up view). With respect to wiring, a length direction generally corresponds to the direction in which an electrical signal (e.g., current) is transmitted (typically to transmit logic signals and/or power between devices (e.g., chips) connected by the wiring).

A first insulating layer 130 may be disposed on the top surface 112 of the package substrate core 110c to cover the wiring patterns 120. The first insulating layer 130 may be an element of the package substrate 110 or may be an additional element. The first insulating layer 130 may cover the entire top surface 112 of the package substrate core 110c except for the landing pads 122. The landing pads 122 in the chip mounting region MR may be exposed by the first insulating layer 130. The first insulating layer 130 may be, for example, a solder resist layer.

In some embodiments, the package substrate 110 may include at least one through-hole 140 through which the molding material 400 passes, in the chip mounting region MR. The through-hole 140 may penetrate the package substrate 110. The through-hole 140 may penetrate the package substrate 110 (including the package substrate core 110c) at a location comprising only an insulating portion of the package substrate 110 in which circuit wires are not disposed (i.e., where neither wiring patterns 120 nor wiring redistribution layers of the package substrate core 110c are disposed with respect to a top down view of the package substrate 110). The through-hole may thus penetrate the package substrate 110 and have sidewalls without any conductive material. A plurality of through-holes 140 may be provided, and may be arranged to align in a direction (here, in a direction perpendicular to the length direction of the extension portions 124 of the wiring patterns 120) and may be spaced apart from each other. The through-holes 140 may be arranged along a central line passing through the center of the chip mounting region MR.

The package substrate 110 may include a receiving channel 142 for receiving the mold material, in the bottom surface 114 of the package substrate 110. The receiving channel 142 may be in fluid communication with the through-holes 140 and may be a groove formed in the bottom surface 114 of the package substrate core 110c and extending in a direction parallel to the bottom surface 114 of the package substrate core 110c. The receiving channel 142 may extend along the central line and may connect the through-holes 140 to each other even when a planar surface or other surface is placed across the bottom of the package substrate 110 (such as a surface of a mold) to thereby facilitate flow of the molding material 400 prior to its solidification.

For example, when a molded underfill process is performed, the molding material 400 between the semiconductor chip 200 and the top surface 112 of the package substrate 110, i.e., an underfill, may fill the receiving channel 142 and the through-holes 140. In this case, the receiving channel 142 may be a pathway through which air in a cavity in a mold apparatus may be evacuated to the outside.

Referring to FIGS. 6 and 7, the landing pads 122 may be arranged around the through-hole 140. In this example, landing pad 122a is located at a central location with respect to a group of wiring patterns 120 that are arranged about a through-hole 140 and extends towards the through hole 140 along a straight line X. In this example, the straight line X extends in a direction parallel to the extension portions 124 of the wiring patterns. The landing pads 122 (e.g., 122b and 122c) may be sequentially upwardly disposed from the straight line X passing through the through-hole 140. The landing pads 122 may be sequentially downwardly disposed from the straight line X passing through the through-hole 140. Extension portions 124 may be arranged in parallel and for each group of extension portions 124 arranged about a through-hole, evenly spaced apart at a first pitch. The landing pads 122 may be radially arranged with respect to the through-hole 140. A first landing pad 122b may be spaced a first vertical distance apart from the straight line X, and a length direction of the first landing pad 122b may be oriented at a first angle θ1 with respect the straight line X. A second landing pad 122c may be spaced a second vertical distance greater than the first vertical distance apart from the straight line X, and a length direction of the second landing pad 122c may be oriented at a second angle θ2 greater than the first angle θ1 with respect the straight line X. Landing pads 122 that are located successively further away from the straight line X may be oriented at angles, with respect to the straight line X, that continue to increase the further the respective landing pad 122 is located away from straight line X. Ends of the wiring patterns 120 (comprising ends of the landing pads 122 adjacent a corresponding through-hole 140) may be arranged at a spacing less than the first pitch (i.e., arranged closer together than the spacing of the extension portions 124). In this example, ends of the wiring patterns 120/landing pads 122 terminate along a line perpendicular to the straight line direction X and are evenly spaced apart at a second pitch, less than the first pitch.

A slope angle of the landing pads 122 with respect to the straight line X may increase as the landing pads 122 are far away from the straight line X. As shown in FIG. 8, for each wiring pattern, the slope angle θ3 of a landing pad 122 may be the angle formed between the length direction of the extension portions 124 of wiring pattern 120 and the length direction of the landing pad 122. It will be appreciated that other portions of the wiring patterns 120 to which the extension portion 124 connect (not shown) may extend in different directions in order to accommodate the electrical connections of the package substrate 110 according to the design of the package 100. As shown, extension portions 124 may comprise a length that is significantly greater than the landing pads 122, such as greater than 10 times or greater than 20 times or the length of the landing pads 122. Although extension portions 124 are shown a linear, in certain designs, the extension portions 124 may not be perfectly linear but comprise minor "jogs" in their extension to the landing pads 122 from remaining portions of the wiring pattern 120.

The conductive bumps 300 may be disposed on the landing pads 123, respectively. The conductive bumps 300 may be attached to chip pads 210 of the semiconductor chip 200, respectively. The semiconductor chip 200 may be mounted on the package substrate 110 by the conductive bumps 300 to be electrically connected to the package substrate 110.

Referring to FIGS. 8 through 11, the conductive bump 300 may have an oval or rectangular shape having an axis of symmetry along the length direction of the landing pad 122. The conductive bump 300 may have a longitudinal length larger than a lateral length, and the longitudinal length may extend along the length direction of the landing pad 122 to which it is connected. Thus, the axis of symmetry of the conductive bump and/or the longitudinal length of the conductive bump 300 may be the same as or otherwise correspond to the length direction of the landing pad 122 to which it is connected. Thus, with respect to a group of landing pads 122 radially extending about a through-hole 140, a group of conductive bumps 300 connected to such group of landing pads 122 may have differently oriented axes of symmetry and/or longitudinal lengths.

In some embodiments, the conductive bump 300 may include a first bump 302 and a second bump 304. The second bump 304 may be formed on the chip pad 210 of the semiconductor chip 200, and the first bump 302 may be formed on the first bump 302. The first bump 302 may include a first metal, and the second bump 304 may include a second metal different from the first metal. For example, the first metal may include tin (Sn), tin/silver (Sn/Ag), tin/copper (Sn/Cu), tin/indium (Sn/In) or etc., and the second metal may include copper (Cu), nickel (Ni) or etc., but the first metal and the second metal are not limited thereto.

Each of the plurality of conductive bumps 300 have a length dimension in a length direction of the conductive bump 300 and a width dimension in a width direction perpendicular to the length direction and smaller than the length dimension. The conductive bumps 300 may have a length direction that extends towards the through-hole 140.

The first bump 302 may have a first length L1, i.e., a first longitudinal length, and the second bump 304 may have a second length L2, i.e., a second longitudinal length less than the first length L1. The first bump 302 may have a first width W1, i.e., a first lateral length, and the second bump 304 may have a second width W2, i.e., a second lateral length greater than the first width W2. For example, the first length L1 of the first bump 302 may range from 50 μm to 90 μm, and the second length L2 of the second bump 304 may range from 30 μm to 60 μm. The first width W1 of the first bump 302 may be less than one third or less than one fifth of the first length L1, and range from 10 μm to 30 μm, and the second width W2 of the second bump 304 may range from 20 μm to 50 μm. A height of the first bump 302 may range from 5 μm to 20 μm, and a height of the second bump 304 may range from 20 μm to 50 μm.

The molding material 400 may be formed on the package substrate 110 to cover the semiconductor chip 200, and then the semiconductor chip 200 may be protected from the outside environment. The molding material 400 may seal the semiconductor chip 200 and the through-hole 140. The molding material 400 may function as the underfill filling a gap between the semiconductor chip 200 and the package substrate 110. The molding material 400 may include an epoxy molding compound (EMC). The molding material 400 may comprise a single homogenous and monolithic structure and fill an area between the lowermost one of the plurality of semiconductor chip(s) 200 and the package substrate 110 and surround the conductive bumps 300 to encapsulate the conductive bumps 300. The molding material 400 may also extend over the top surface of the semiconductor chip(s) 200 to encapsulate the semiconductor chip(s) 200.

External connection pads 150 may be disposed on the bottom surface 114 of the package substrate core 110c, and an electrical signal may be supplied to/from the semiconductor chip 200 through the external connection pads 150.

The external connection pads 150 may be exposed by a second insulating layer 160. The second insulating layer 160 may include a silicon oxide layer, a silicon nitride layer or a silicon oxynitride layer. External connection terminals 500 may respectively be disposed on the external connection pads 150 of the package substrate 110 to be electrically connected to an external device. The external connection terminals 500 may be, for example, solder balls. The semiconductor package 100 may be mounted on a module substrate using the solder balls as a connecting medium to form part of a memory module.

According to example embodiments, the semiconductor package 100 may include the package substrate 110 including the at least one through-hole 140 for allowing the molding material to pass through in the chip mounting region MR and the plurality of landing pads 122 that are disposed on the top surface 112 of the package substrate 110 in the chip mounting region MR and are connected to the conductive bumps 300. At least some of the landing pads 122 may each obliquely extend at a certain angle toward the through-hole 140. The conductive bumps 300 may each have the longitudinal length greater than the lateral length. The length direction (i.e., a longitudinal direction) of each of the landing pads 122 may extend toward the through-hole 140. The length direction of each of the landing pads 122 may be parallel to a direction in which each of the landing pads 122 extends toward the through-hole 140. The landing pads 122 may be radially arranged with respect to the through-hole 140.

Thus, when the molded underfill process is performed, the landing pads 122 and the conductive bumps 300 may not interrupt a movement of the underfill, such that the underfill can flow at a uniform rate. Accordingly, a void in the underfill may be minimized or prevented from being generated.

Hereinafter, a method of manufacturing the semiconductor package of FIG. 1 will be described.

Figure 12:
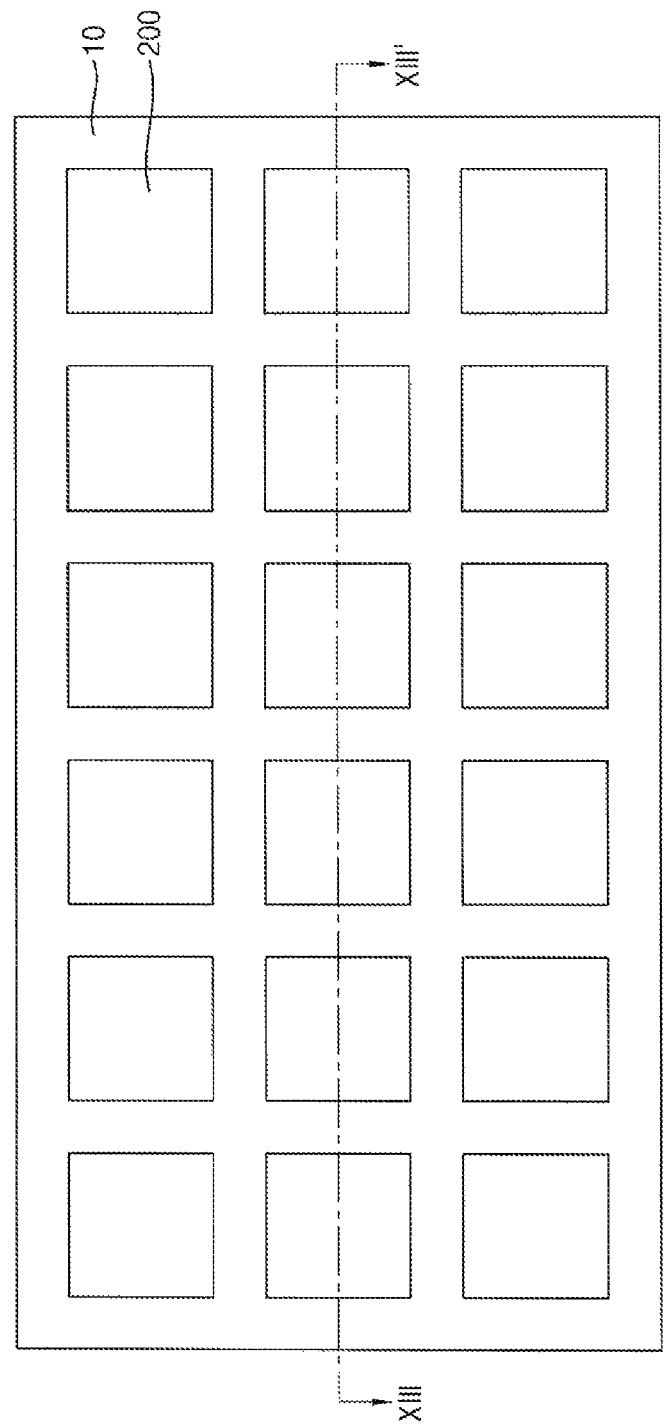
FIGS. 12 through 15 are cross-sectional views illustrating a method of manufacturing a semiconductor package according to an example embodiment.
Figure 13:
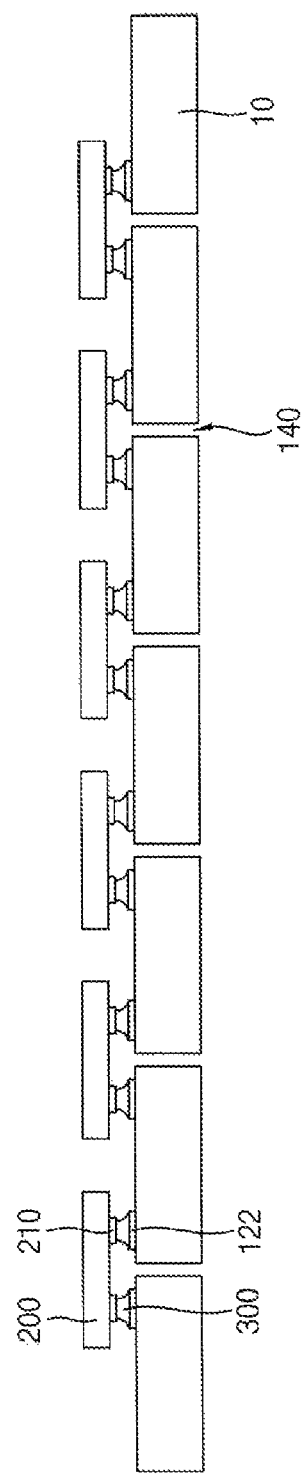
Figure 14:
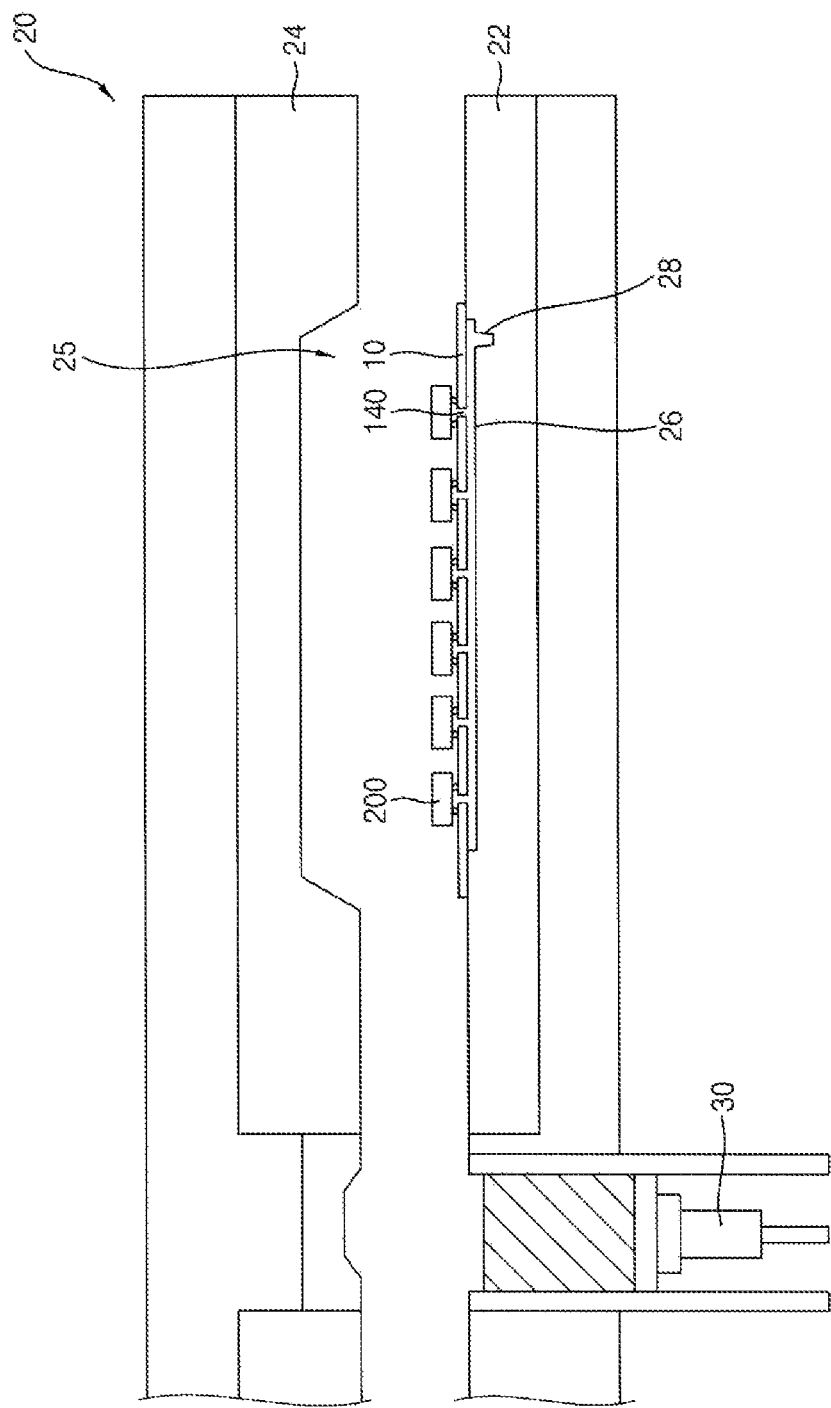
Figure 15:
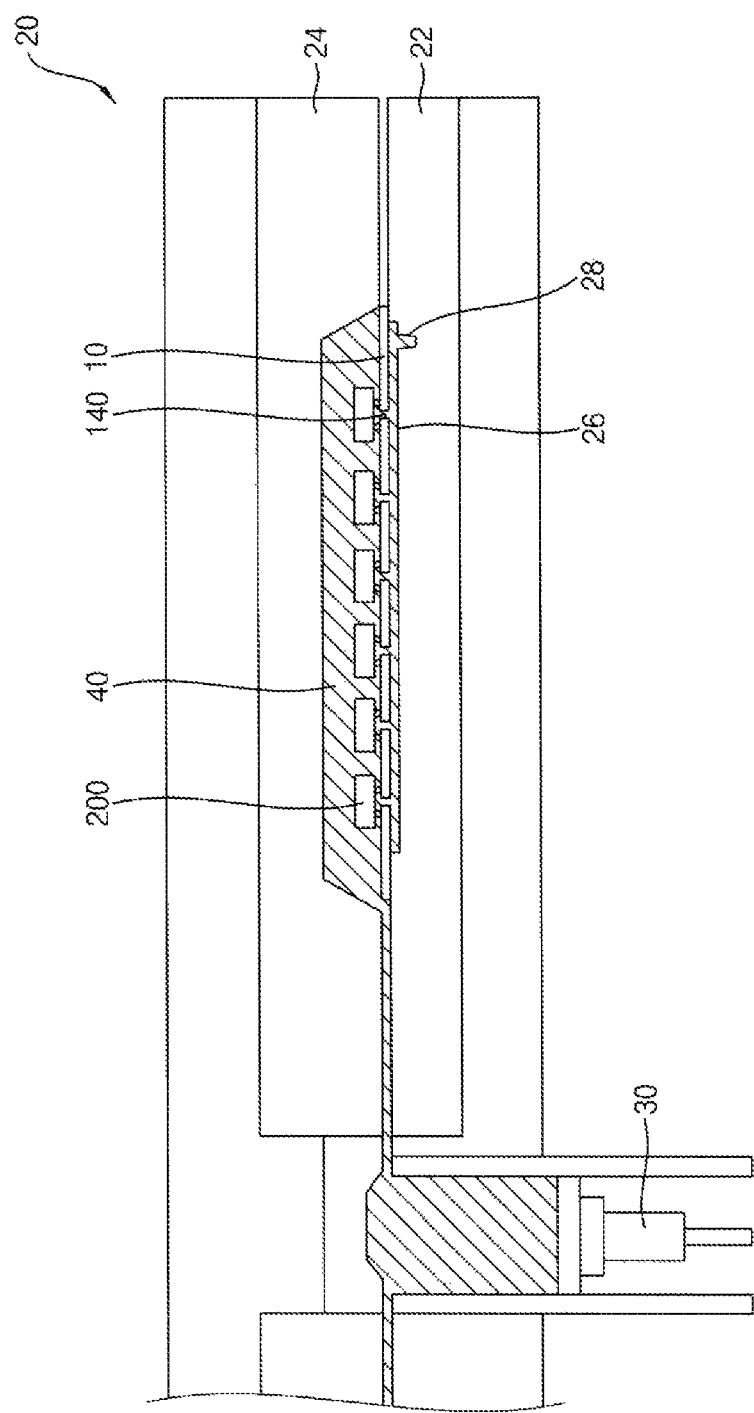
Figure 16:
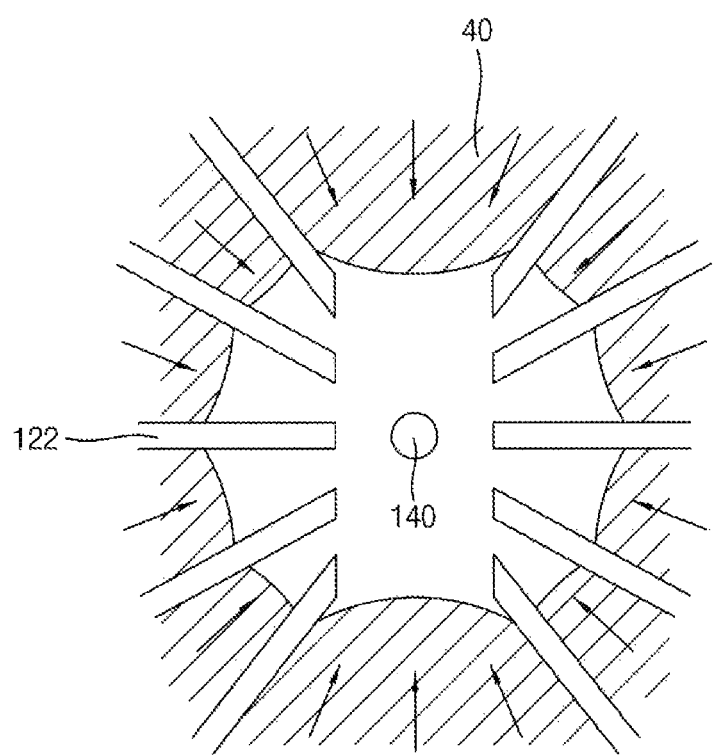
FIG. 16 is a plan view illustrating a flow direction of an underfill on the printed circuit board substrate during a molded underfill process of FIG. 15.

FIGS. 12 through 15 are cross-sectional views illustrating a method of manufacturing a semiconductor package according to an example embodiment. FIG. 12 is a plan view illustrating semiconductor chips mounted on a printed circuit board substrate. FIG. 13 is a cross-sectional view taken along line XIII-XIII' of FIG. 12. FIGS. 14 and 15 are cross-sectional views illustrating a method of encapsulating the semiconductor chip using a molding apparatus. FIG. 16 is a plan view illustrating a flow direction of an underfill on the printed circuit board substrate during a molded underfill process of FIG. 15.

Referring to FIGS. 12 and 13, a plurality of semiconductor chips 200 may be mounted on a substrate 10. The substrate 10 may comprise a plurality of connected package substrates 110 prior to cutting of the substrate 10.

In some embodiments, after forming conductive bumps 300 on chip pads 210 on a bottom surface of each of the semiconductor chips 200, the semiconductor chips 200 may be mounted on the substrate 10 using the conductive bumps 300 as a connecting medium and may be arranged in a matrix form. The conductive bumps 300 may be disposed on connection pads, e.g., landing pads 122, of the substrate 10, respectively, and then the conductive bumps 300 may be respectively attached on the landing pads 122 by a reflowing process such that the semiconductor chips 200 may each be mounted on the substrate 10.

For example, after forming a seed layer on each chip pad 210 on the bottom surface of each of the semiconductor chips 200, a plating process may be performed on the seed layer to sequentially form a lower bump portion and an upper bump portion. In some examples, chip pad 210 and/or an exposed portion of the chip pad 210 to which the plating process is performed may have a shape (with respect to a bottom up view) having an axis of symmetry that aligns with the length direction of the landing pad 122 to which it will be (is) connected via its corresponding conductive bump 300 (and thus, different chip pads 210 may be aligned in different directions, such as described herein with respect to the landing pads 122). The lower bump portion and upper bump portion may be a single homogenous bump or may be formed as separate bumps (e.g., corresponding to second bump 304 and first bump 302 described herein). Accordingly, the conductive bumps 300 may each include a lower bump portion and an upper bump portion. In some examples the lower bump portion and upper bump portion may be formed from different materials. The lower bump may include a first conductive material with a first ductility, and the upper bump may include a second conductive material with a second ductility greater than the first ductility. The first conductive material may include copper (Cu), nickel (Ni) or etc., and the second conductive material may include tin (Sn), tin/silver (Sn/Ag), tin/copper (Sn/Cu), tin/indium (Sn/In) or etc. After the reflow process, each of the conductive bumps 300 connected to a corresponding landing pad 122 may have a shape, alignment and dimensions as described above, such as with respect to FIGS. 6-11. For example, such conductive bumps 300 may have an upper portion (corresponding to first bump 302) having a length direction aligned with the length direction of the landing pad 122 to which it is connected and a lower portion (corresponding to second bump 304) having a dimension in this length direction less than that of the upper portion.

The substrate 10 may be a printed circuit board (PCB) substrate. The substrate 10 may include a chip mounting region for mounting the plurality of semiconductor chips 200. The plurality of semiconductor chips 200 may be disposed on the chip mounting region. The substrate 10 may include at least one through-hole 140 through which a molding material passes. The through-hole 140 may penetrate the substrate 10. A plurality of through-holes 140 may be arranged in a first direction in each of the chip mounting regions and may be spaced apart from each other. The substrate 10 may include a receiving channel similar to or the same as the receiving channel 142 in FIGS. 2 and 5 in the bottom surface thereof for each chip mounting region. The receiving channel may connect the plurality of through-holes 140 of each chip mounting region to each other and may be formed as a groove on the bottom surface of the substrate 10. The receiving channel may extend in a first direction. In this example, the first direction may extend in a direction parallel to sides of the package substrate 110 (after their separation) (see FIG. 2, e.g.).

The substrate 10 may include a plurality of landing pads 122 in the chip mounting region, such as those described with respect to FIGS. 1-11. The landing pads 122 may be arranged adjacent to the through-hole 140 in the first direction and may be spaced apart from each other. The landing pads 122 may be disposed around the through-hole 140. The landing pads 122 may be radially disposed with respect to the through-hole 140. The landing pads 122 may each have a longitudinal length greater than a lateral length. The landing pads 122 may each have a length direction (i.e., a longitudinal direction) extending toward the through-hole 140.

Referring to FIGS. 14 through 16, the molding material may be formed on the top surface of the substrate 10 to cover the semiconductor chips 200.

In some embodiments, the semiconductor chips 200 may be mounted on the substrate 10 by a flip chip bonding process.

As shown in FIGS. 14 and 15, a molded underfill (MUF) process may be performed using a molding apparatus 20. After disposing the semiconductor chip 200 in a cavity 25 between a lower mold 22 and an upper mold 24 of the molding apparatus 20, the molding material 40 such as a mold resin may be injected into the cavity 25 in a state in which the lower and upper molds 22 and 24 are clamped together, to mold the semiconductor chips 200. The molding material 40 may include an epoxy mold compound.

A flowing channel 26 for allowing the molding material 40 to flow may be formed in an upper surface of the lower mold 22 and in fluid communication with one or more through-holes 140 of the substrate 10. The flowing channel 26 may be connected to an evacuation hole through a reservoir 28 for storing the molding material 40. When the molding material 40 is injected, the cavity 25 may be vacuum evacuated and air in the cavity 25 may be evacuated to the outside through the flowing channel 26 and the evacuation hole. As a result, part of the molding material 40 may fill the receiving channels in the bottom surface of the substrate 10.

When the molding material 40 is injected into the cavity 25 during the molded underfill process, the air in the cavity 25 may be evacuated to the outside through the through-hole 140 and the flowing channel 26 such that a resin filling property may be improved.

As shown in FIG. 16, the landing pads 122 may each have the length direction (the longitudinal direction) extending toward the through-hole 140 and may be radially disposed with respect to the through-hole 140, and thus the landing pads 122 around the through-hole 140 and the conductive bumps 300 on the landing pads 122 may not interrupt a flow of the molding material i.e., a flow of the underfill flow, such that the molding material (e.g., the mold resin) 40 is injected at a uniform rate as a whole. Thus, in the molded underfill process, a void between each of the semiconductor chips 200 and the substrate 10 may be minimized or prevented from being generated.

After injecting the molding material 40 into in the flowing channel 26, the molding material 40 is cured so that the molding material 40 hardens. The plurality of semiconductor chips 200, thus mounted on the substrate 10, may be subjected to a dicing process to separate the semiconductor chips 200 into separate semiconductor packages 100 such as described herein with respect to FIGS. 1-11 (it will be appreciated that each semiconductor package 100 may include more than one of the plurality of semiconductor chips 200). Thus, a plurality of flip chip packages may be manufactured.

The above-described method of manufacturing the semiconductor package may be applied to a method of manufacturing a semiconductor package including a logic device or a memory device. The semiconductor package may include the logic device such as a central processor unit (CPU) or an application processor (AP), a volatile memory device such as DRAM or SRAM or non-volatile memory device such as a flash memory, PRAM, MRAM or RRAM.

While the present inventive concepts have been particularly shown and described with reference to example embodiments thereof, it will be understood by those of ordinary skill in the art that various changes in form and details may be made therein without departing from the spirit and scope of the present disclosure as defined by the following claims. For example, although each of the landing pads 122 are shown to have a length direction that is different from each of neighboring landing pads 122, continuous sub-groups of landing pads 122 may have the same length direction, and each the length direction may alter with respect to each sequential subgroup of landing pads 122. For example, with respect to a group of landing pads clustered around the same through-hole 140, each sub-group of three neighboring landing pads 122 may have the same length direction but different with respect to adjacent sub-groups of landing pads 122. Further, while the example embodiments show landing pads 122 extending toward a corresponding through-hole 140 with a length direction that intersects the through-hole 140 location, the landing pads 122 need not extend toward a corresponding through-hole 140 in such a manner. Further, not all of the landing pads 122 may be formed with an oblique angle with respect to the extension portion 124 to which they are connected. In addition to landing pads 122 connected to extension portions 124 that have a length direction aligned with the corresponding through-hole 140 (such as landing pad 122a described herein), other configurations may provide for only some of the landing pads 122 to be formed as described herein with respect to the exemplary embodiments (e.g., a majority of a continuous group of landing pads 122 formed about a through-hole 140). For example, a group of wiring patterns 120 may have extension portions 124 extending in the same first direction, with every other wiring pattern 120 being formed with a landing pad 122 having an oblique angle with respect to the corresponding extension portion 124 (e.g., as described herein), and additional wiring patterns interposed therebetween having landing pads extending in the first direction (such landing pads may be positioned further away from the through-hole 140 in the left-right direction with respect to the layout shown in FIG. 6, e.g.). Other modifications will be apparent in accordance with the spirit and scope of the present disclosure.

What is claimed is:

1. A package substrate for a semiconductor package, comprising:
    a substrate core including a through-hole penetrating the substrate core in a chip mounting region; and
    a plurality of wiring patterns on a top surface of the substrate core, each of the plurality of wiring patterns including a landing pad and an extension portion connected to the corresponding landing pad, wherein with respect to a top down view, at least some of the landing pads extend toward the through-hole in the chip mounting region and a spacing between adjacent ones of the landing pads decreases as the landing pads get closer to the through-hole.

2. The package substrate of claim 1, wherein first ends of the landing pads adjacent to the through-hole are spaced apart at a first pitch and second ends of the landing pads connected to the corresponding extending portions and opposite to the corresponding first ends are spaced apart at a second pitch greater than the first pitch.

3. The package substrate of claim 1, wherein each of the landing pads comprises a terminal of a respective one of the plurality of wiring patterns.

4. The package substrate of claim 1, wherein the landing pads are radially disposed with respect to the through-hole.

5. The package substrate of claim 1, wherein, with respect to a top down view, the landing pads are symmetrically arranged about a straight line parallel to the top surface of the substrate core and passing through the through-hole.

6. The package substrate of claim 5,
    wherein the landing pads include a first landing pad spaced a first distance apart from the straight line and a second landing pad spaced a second distance greater than the first distance apart from the straight line, and
    wherein a length direction of the first landing pad is oriented at a first angle with respect to the straight line, and a length direction of the second landing pad is oriented at a second angle greater than the first angle with respect to the straight line.

7. The package substrate of claim 5, wherein the landing pads have a respective slope angle with respect to the straight line, the slope angle of each landing pad being greater as a function of a distance away from the straight line.

8. The package substrate of claim 5, wherein the extension portions are parallel to each other and are spaced apart from each other in a direction perpendicular to the straight line.

9. The package substrate of claim 1, wherein, with respect to a top down view, at least some of the landing pads are connected to corresponding ones of the extension portions at an oblique angle.

10. The package substrate of claim 1, wherein the substrate core further includes a receiving channel formed in a bottom surface of the substrate core, the receiving channel being in fluid communication with the through-hole.

11. A package substrate for a semiconductor package, comprising:
    a substrate core including a through-hole penetrating the substrate core in a chip mounting region; and
    a plurality of wiring patterns on a top surface of the substrate core, each of the plurality of wiring patterns including a landing pad and an extension portion connected to the corresponding landing pad, wherein with respect to a top down view, at least some of the landing pads extend toward the through-hole in the chip mounting region, a spacing between adjacent ones of the landing pads is greater as a function of a distance away from the through-hole, and the landing pads are configured to be connected to an external device in the chip mounting region of the substrate core.

12. The package substrate of claim 11, wherein the landing pads and the extension portions of the wiring patterns are directly on the top surface of the substrate core.

13. The package substrate of claim 11, wherein first ends of the landing pads adjacent to the through-hole are spaced apart at a first pitch and second ends of the landing pads connected to the corresponding extending portion and opposite to the corresponding first ends are spaced apart at a second pitch greater than the first pitch.

14. The package substrate of claim 11, wherein the landing pads are radially arranged with respect to the through-hole.

15. The package substrate of claim 11, wherein the landing pads include a first landing pad spaced a first distance apart from a straight line passing through the through-hole and a second landing pad spaced a second distance greater than the first distance apart from the straight line, and wherein a length direction of the first landing pad is oriented at a first angle with respect to the straight line, and a length direction of the second landing pad is oriented at a second angle greater than the first angle with respect to the straight line.

16. The package substrate of claim 15, wherein at least some of the landing pads have a slope angle with respect to the straight line that increases as a function of a distance of the landing pad from the straight line.

17. The package substrate of claim 15, wherein the extension portions are parallel to each other and are spaced apart from each other in a direction perpendicular to the straight line.

18. The package substrate of claim 11, wherein, with respect to a top down view, at least some of the landing pads are connected to corresponding ones of the extension portions at an oblique angle.

19. The package substrate of claim 11, wherein, with respect to a top down view, the landing pads each have a length direction aligned to intersect the through-hole.

20. The package substrate of claim 11, wherein the substrate core further includes a receiving channel formed in a bottom surface of the substrate core, the receiving channel being in fluid communication with the through-hole.

* * * * *